(12) United States Patent
Stevenson et al.

(10) Patent No.: US 7,236,059 B2
(45) Date of Patent: Jun. 26, 2007

(54) APPARATUS, SYSTEM, AND METHOD FOR OSCILLATOR NETWORK WITH MULTIPLE PARALLEL OSCILLATOR CIRCUITS

(75) Inventors: Paul E. Stevenson, Colorado Springs, CO (US); Jon Tourville, Colorado Springs, CO (US); William Lahey, Colorado Springs, CO (US)

(73) Assignee: Intel Corporation, Santa Clara, CA (US)

( * ) Notice: Subject to any disclaimer, the term of this patent is extended or adjusted under 35 U.S.C. 154(b) by 70 days.

(21) Appl. No.: 11/172,133

(22) Filed: Jun. 29, 2005

(65) Prior Publication Data

US 2007/0001774 A1    Jan. 4, 2007

(51) Int. Cl.
*H03B 5/00* (2006.01)
*H03B 5/36* (2006.01)

(52) U.S. Cl. .................... 331/46; 331/55; 331/158

(58) Field of Classification Search .............. 331/2, 331/16, 46, 55, 116 R, 116 FE, 158; 375/376; 455/75, 76, 575
See application file for complete search history.

(56) References Cited

U.S. PATENT DOCUMENTS 5,565,816 A * 10/1996 Coteus ...................... 331/2
5,909,144 A *  6/1999 Puckette et al. ............ 327/551
6,898,721 B2 *  5/2005 Schmidt ..................... 713/322

* cited by examiner

*Primary Examiner*—David Mis
(74) *Attorney, Agent, or Firm*—Kacvinsky LLC (57) ABSTRACT

A system, apparatus, and method to connect an oscillator network to multiple parallel oscillator circuits. The apparatus may include multiple modules located within a platform, where each of the multiple modules includes an internal oscillator circuit and the platform includes an input port; and an oscillator network located external to the platform. The oscillator network is coupled to each of said internal oscillator circuits through the input port. Other embodiments are described and claimed.

28 Claims, 4 Drawing Sheets

APPARATUS, SYSTEM, AND METHOD FOR OSCILLATOR NETWORK WITH MULTIPLE PARALLEL OSCILLATOR CIRCUITS

BACKGROUND

The wireless data industry is growing rapidly. New generations of wireless technologies and users thereof demand intelligent and powerful products. New technology-based platforms to meet these growing requirements are being developed. For example, developers of next generation wireless, mobile, and handheld data devices require integrated circuit (IC) devices that balance performance and low power consumption, as well as a reduction in components and an expansion in storage options to meet form factor and system requirements. A current trend in the development of new mobile platforms for wireless, mobile, and handheld devices is to incorporate multiple processors in a device. Each processor may be highly specialized to perform very specific functions such as communications and data processing. For example, mobile platforms are now beginning to incorporate multiple processors with the opportunities in the future of incorporating many more highly specialized and optimized processors. For example, in mobile platforms, communication processors are used for communications related functionality and applications processors are used for computation intensive data applications. In conventional multi-processor mobile platforms, each processor may include its own specific internal oscillator circuit to generate the clock signals to drive the processors and other logic devices. Each internal oscillator circuit are either driven by separate independent external oscillator networks that may include, for example, a network of crystals and capacitors or are ported from one processor to another through dedicated input/output pins.

In some mobile platforms that include multiple processors, each processor has an internal oscillator circuit connected to its own external oscillator network that includes an independent crystal and capacitors network. In other mobile platforms, clock signals are ported from one processor to another. In some applications, because of the independent oscillator networks, the mobile platform may require numerous additional external components to condition and synchronize the clock signals between the multiple processors. Conventional processors generally include an oscillator input port to receive an oscillator input from an external oscillator network to generate its clock signal. Such processors also include separate clock input and output ports to receive clock signals from other processors or to provide an internally generated clock signal to another processor. Thus, each processor in a multi-processor platform may require two additional input/output ports, one to receive a clock signal from another processor and one to provide a clock signal to another processor or logic device on the mobile platform. Providing separate external oscillator networks to each internal oscillator circuit increases overall cost due to the increase in component count and reduces overall reliability of such mobile platforms. Porting clock signals require the use of extra input/output pins in the processor that are separate from the crystal network input pins. Both implementations require additional real estate either at the chip level or the platform level.

In one example, a conventional multi-processor mobile platform may include a communication processor and an application processor, among other processors. An external oscillator network is connected to the oscillator input of the application processor from which the application processor generates a 32 kHz clock signal. The 32 kHz clock signal is then ported through an output pin of the application processor to the clock input pin of the communication processor. The communication processor may include an automatic amplitude control (AAC) oscillator, which may be sensitive to the slew rate of the 32 kHz clock signal provided by the application processor. Thus, additional signal conditioning circuits and components may be required to condition and synchronize the clock signal from the application processor to make it compatible with the communication processor clock signal requirements.

DETAILED DESCRIPTION

Figure 1:
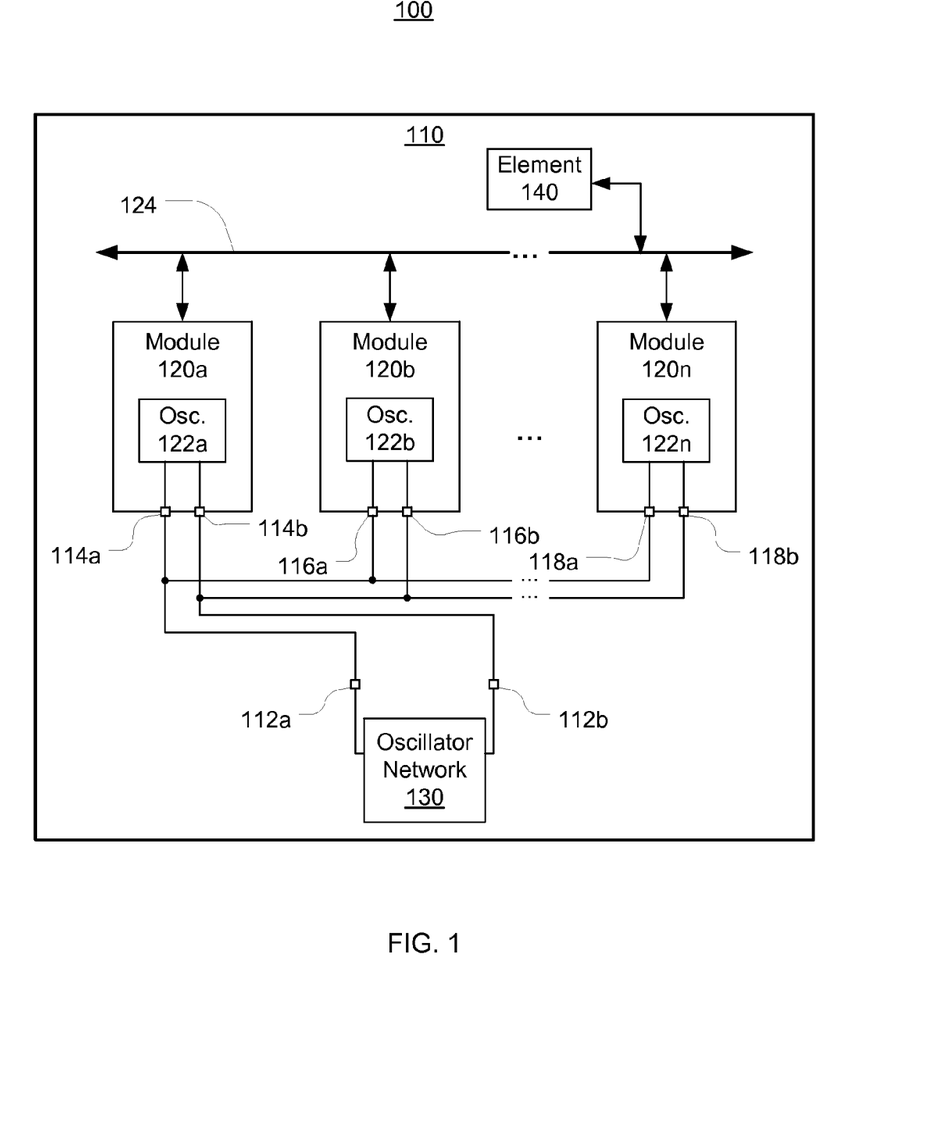
FIG. 1 illustrates one embodiment of a block diagram of a system 100.

FIG. 1 illustrates one embodiment of a block diagram of a system 100. System 100 may comprise, for example, a substrate 110 comprising multiple modules 120a, 120b, 120n, where "n" may be a positive integer. It can be appreciated that although "n" may be relatively large number, there is an upper limit to "n" which represents how many circuits may be connected in parallel to a crystal. For example, in one embodiment, the upper limit for "n" may depend on the crystal's frequency, mode of operation, mass, and other crystal parameters, and how powerful the oscillator circuit is that the crystal is connected to. In one embodiment, the oscillator's power may be proportional to the power capabilities of oscillator's inverter, for example. Those skilled in the art can appreciate that the upper limit for "n" may have to be calculated for each embodiment, for example.

In one embodiment, substrate 110 may comprise a platform comprising an external oscillator network 130 that may include a crystal network, as well as other supporting circuits and circuit components, for example. It can be appreciated that in one embodiment, external oscillator network 130 (e.g., crystal) may be located in close proximity to the oscillator pins 112a–b on substrate 110. Substrate 110 may comprise for example, a printed circuit board (PCB), a hybrid circuit, a thick-film circuit, integrated circuit, and the like. Substrate 110 may form a portion of a platform, for example.

Each module 120a–n may comprise an internal oscillator circuit 122a, 122b, 122n, respectively, for example. Each module 120a–n may communicate with each other via a bus 124, for example, and may communicate with element 140 via bus 124. Modules 120a–n each may be connected to external oscillator network 130, which may comprise, for example, crystals, capacitors, resonators, inductors, transistors, diodes, and any other component used to generate an accurate time/frequency base for modules 120a–n, which may comprise processors and digital logic devices, for example. As shown, each internal oscillator circuit 122a–n may be connected in parallel to external oscillator network 130 via oscillator pins 112a–112b. In one embodiment, oscillator pin 112a may be connected to oscillator input pins 114a, 116a, and 118a and oscillator pin 112b may be connected to oscillator input pins 114b, 116b, and 118b. Modules 120a–n each receives an oscillator signal from the same external oscillator network 130 to drive respective internal oscillator circuits 122a–n, for example. In one embodiment, an external oscillator network 130 connection may be routed internally between modules 120a–n so that each module is driven by the same reference external oscillator network 130. Each internal oscillator circuit 122a–n uses the time/frequency base generated by external oscillator network 130 to generate a clock signal time base for its respective module 120a–n. In one embodiment, for example, a phase-lock loop (PLL) and dividers may be used to generate multiple clock frequencies. In one embodiment, the oscillator frequency may be a fixed frequency.

Accordingly, in one embodiment, system 100 provides a single oscillator network 130 external to and connected to two or more oscillator circuits 122a–n of respective modules 120a–n. In one embodiment, interconnecting a single oscillator network 130 externally to modules 120a–n may serve to synchronize internal oscillator circuits 122a–n and resulting clock signals with no additional conditioning and synchronizing circuits or components. Furthermore, in one embodiment, this technique may use fewer external components such as crystals and parallel capacitors, which may be required in conventional implementations. For example, a conventional implementation provides separate independent external crystal networks for each module to drive each module's oscillator circuits. In addition to the extra crystal and parallel capacitor components, conventional implementations using multiple independent external crystal oscillator networks to drive the internal oscillator circuits also require additional circuits and components to synchronize the clock signals generated by the internal oscillators.

Embodiments of system 100 may comprise multi-processor mobile platforms for wireless handsets, for example. In one embodiment, a wireless handset may comprise an application processor (AP), a communication processor (CP), among other processors, for example. Accordingly, in one embodiment, system 100 may comprise a substrate 110 which may form or may comprise a mobile platform where module 120a may be an AP, module 120b may be a CP, and any modules up to 120n may be any type of digital processor, controller, and/or logic device that utilizes a clock signal, for example. In one embodiment, one or both AP and CP comprising a mobile platform on substrate 110 may use a current limited 32 kHz oscillator with AAC, for example. The embodiments, however, are not limited to any specific oscillator frequency. Accordingly, in one embodiment, oscillator network 130 may comprise a crystal oscillator to generate a frequency/time base and may be simultaneously connected to modules 120a–n via internal oscillator input pins 114a–b, 116a–b, and 118a–b. Each respective internal oscillator circuit 122a–n then may generate its own internal clock signal derived from a single external oscillator network 130 frequency/time base. In one embodiment, oscillator network 130 may provide a 32 kHz crystal oscillator clock frequency/time base to internal oscillator circuits 122a–n so that modules 120a–n can operate with a synchronized 32 kHz clocks, for example, although the embodiments are not limited to any specific oscillator frequency.

Embodiments of system 100 may comprise module 120a in the form of an AP and module 120b in the form of a CP, where each module 120a, b may comprise a similar internal oscillator 122a, b circuit comprising AAC. Accordingly, to minimize overall power consumption, both AP and CP internal oscillator circuits 122a, b may be connected to the same oscillator network 130, for example. This technique allows both internal oscillator circuits 122a, 122b to detect the amplitude of oscillation and scale back their drive current to minimize the amplitude. In one embodiment, to oscillator network 130 it appears as though it is driving a single internal oscillator circuit with drive strength equal to the sum of the two individual oscillator circuits 122a, 122b, for example.

Accordingly, embodiments of system 100 may comprise fewer external components compared to conventional implementations requiring multiple independent crystals and parallel capacitor networks on substrate 110. Internal clock signals may be generated by internal oscillator circuits 122a–n simultaneously from a single oscillator network 130. Substrate 110 requires only oscillator pins 112a–112b to provide a frequency/time base reference to all modules 120a–n to receive oscillator network 130 frequency/time base rather than requiring up to n external oscillator input ports. As previously indicated, conventional implementations typically may use a processor to provide a buffered clock output that is separate from oscillator pins 112a–112b to drive other processors or modules in a given platform. In one embodiment, these additional "porting" pins are not required because the oscillator network 130 is provided simultaneously to each module 120a–n. Therefore, in one embodiment, at least two porting pins may be freed up in the module architecture to be used otherwise or may be eliminated to free up space and reduce the size of the overall module. In one embodiment, therefore, system 100 may be cheaper and more reliable than conventional implementations, and also may provide a considerable reduction in power consumption, and power supply and ground noise compared to conventional implementations that use buffered clock output porting techniques.

The techniques described herein with respect to the various embodiments are in contrast to conventional techniques of providing multiple external oscillator networks and porting a clock signal from one module to another through a buffer. For example, in conventional implementations the clock signal from one module may be provided to a dedicated buffered output pin, which then may be connected to the oscillator input pin of another module, and so forth. Such techniques, however, may require extra input/output pins in the module for exporting and/or importing the buffered clock signals, for example, and increases the pin count for the module and increases the cost and real-estate of the platform. In addition, for example, when porting clock waveforms generated by internal oscillator circuits between modules may require some form of waveshaping to ensure that oscillators are compatible when interconnected between the modules. For example, the output of one oscillator circuit may be ported after waveshaping through a Schmitt trigger or some other amplification device, for example, out of a general purpose input/output (GPIO) interface, then to the subsequent modules (e.g., processors). This may require considerable power to be consumed in the GPIO interface and may require some form of clock signal waveshaping, for example. A common conventional implementation connects a first module to a second module (e.g., a first processor connected to a second processor) with the first module connected to an external crystal network. Then, the low impedance node of a first oscillator circuit in the first module may be connected to the high impedance node of a second oscillator circuit in the second module, and so forth, for example.

As previously discussed, a CP oscillator circuit with AAC may be sensitive to the slew rate of ported clock signals. Thus, conventional porting techniques may require some form of clock buffering and/or conditioning in order to export and import clock signals between modules. For example, in conventional implementations, the AP may use a Pierce type oscillator that makes it difficult or impractical to export and/or import clock signals between the CP and the AP.

Figure 2:
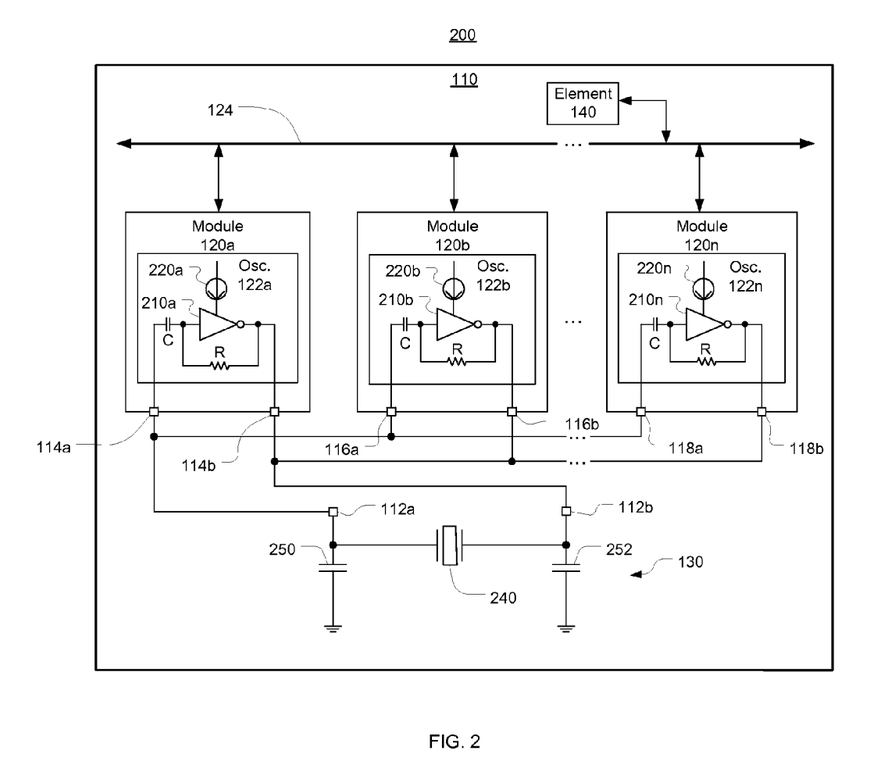
FIG. 2 illustrates one embodiment of a system 200.

FIG. 2 illustrates one embodiment of system 200. System 200 may represent one embodiment of system 100, for example. Accordingly, system 200 illustrates one embodiment of each internal oscillator circuit 122a–n within modules 120a–n and illustrates one embodiment of external oscillator network 130, for example. Each internal oscillator circuit 122a–n is connected in parallel to oscillator network 130, for example. In one embodiment, oscillator network 130 may comprise, for example, a crystal 240 connected to capacitors 250 and 252, for example. In one embodiment, capacitors 250, 252 may be integrated within modules 120a–n, for example. In one embodiment, crystal 240 may form the primary frequency determining element in external oscillator network 130. In one embodiment, crystal 240 may be integrated within modules 120a–n, for example. In one embodiment, a ceramic resonator may be used in place of crystal 240, for example. A crystal 240 based oscillator may be held to extreme accuracy of frequency stability. Temperature compensation may be applied to crystal 240 oscillator to improve thermal stability thereof. Each internal oscillator circuit 122a–n may comprise an inverter 210a–n coupled to a current source 220a–n. Current sources 220a–n may be used to scale back oscillator drive current associated with the multiple oscillator circuits based on detected amplitude of the external frequency reference signal from oscillator network 130, for example. Each internal oscillator 122a–n may comprise input coupling capacitors C1, C2, C3 coupled to internal oscillator input pins 114a, 116a, and 118a, respectively. As shown, internal oscillator input pins 114a, 116a, and 118a are connected to oscillator pin 112a. Each internal oscillator circuit 122a–n also may comprise a feedback resistor R1, R2, R3 coupled between each oscillator input pins 114b, 116b, and 118b and the input to buffers 210a–n, respectively. As shown oscillator input pins 114b, 116b, and 118b are connected to external oscillator input pin 112b. Internal to substrate 110, internal oscillator pins 114a, 116a, and 118a are connected together and internal oscillator input pins 114b, 116b, and 118b also are connected together to provide an oscillator network 130 signal to each internal oscillator 122a–n.

In one embodiment, for example, substrate 110 may comprise a mobile platform for wireless, mobile, and handheld devices that incorporates multiple processors. As previously discussed, in one embodiment, these processors may include at least an AP and a CP, among other processing and logic devices, for example. Modules 120a–n may represent any one of such processors. In one embodiment, each module 120a–n may be highly specialized to perform very specific functions. For example, in mobile platforms incorporating multiple processors, modules 120a–n may comprise a CP to communicate information and an AP to perform intensive data computations. Thus, in one embodiment, substrate 110 may comprise a mobile platform where each module 120a–n shares single external oscillator network 130 and where each internal oscillator 122a–n is internally interconnected to receive a single frequency reference from external oscillator network 130. Accordingly, substrate 110 may comprise a single oscillator input port comprising oscillator pins 112a and 112b to provide the oscillator network 130 frequency/time base reference to each of oscillator circuits 122a–n, for example.

In multiple processor mobile platform applications, each separate internal oscillator circuit 122a–n shares oscillator network 130 to minimize the total number of crystals 240 and capacitors 250, 252 required to operate internal oscillator circuits 122a–n. This technique also minimizes the number of other external components that may be required to condition and synchronize internal oscillator circuits 122a–n, for example. In one embodiment, common oscillator network 130 may reduce the overall cost of a mobile platform and at the same time may increase its overall reliability. Unlike conventional oscillators in multiple processor implementations that typically require a separate clock output pin to provide its clock signal to another processor and a clock input pin to receive a clock signal from another processor, in one embodiment, all internal oscillator circuits 122a–n are coupled to a common external oscillator pins 112a, b. Furthermore, in one embodiment, modules 120a–n do not require separate clock output and crystal input pins. Each module 120a–n may comprise at least two pins (e.g., a port) 114a–b, 116a–b, and 118a–b to drive internal oscillator circuits 122a–n. Internal oscillator circuits 122a–n use the same frequency/time base reference from the oscillator network 130 to generate an internal clock signal, for example.

Accordingly, design of mobile platforms comprising substrate 110 and interconnection of external crystal networks may be simplified if each module 120a–n is driven by the same oscillator network 130. In one embodiment, substrate 110 may use existing oscillator input pins 114a–b, 116a–b, and 118a–b, may reduce component count by minimizing the number of external crystals 240 and capacitors 250, 252, and permits AAC type input oscillator circuits 122a–n to minimize power consumption. For example, power consumption of an AAC oscillator depends on the amplitude of the oscillation signal. In one embodiment, for example, substrate 110 may comprise multiple modules 120a–n that share a single identical oscillator network 130.

Embodiments of systems 100, 200 discussed above may comprise, for example, multiple nodes. A node may comprise any physical or logical entity having a unique address in system 100, 200. Examples of a node may include, but are not necessarily limited to, a computer, server, workstation, laptop, ultra-laptop, handheld computer, telephone, cellular telephone, personal digital assistant (PDA), router, switch, bridge, hub, gateway and so forth. The unique address may comprise, for example, a network address such as an Internet Protocol (IP) address, a device address such as a Media Access Control (MAC) address, and so forth. The embodiments are not limited in this context.

Embodiments of nodes of systems 100, 200 may be arranged to communicate different types of information, such as media information and control information. Media information is used herein in a very general sense and may refer to any data representing content meant for a user, such as voice information, video information, audio information, text information, numerical information, alphanumeric symbols, graphics, images, symbols, and so forth. Control information is also used herein in a very general sense and may refer to any data representing commands, instructions or control words meant for an automated system. For example, control information may be used to route media information through a system, or instruct a node to process the media information in a certain manner. The embodiments are not limited in this context.

Embodiments of nodes of systems 100, 200 may communicate media and control information in accordance with one or more protocols. A protocol may comprise a set of predefined rules or instructions to control how the nodes communicate information between each other. The protocol may be defined by one or more protocol standards as promulgated by a standards organization, such as the Internet Engineering Task Force (IETF), International Telecommunications Union (ITU), the Institute of Electrical and Electronics Engineers (IEEE), and so forth.

Embodiments of nodes of systems 100, 200 may be implemented as a wired communication system, a wireless communication system, or a combination of both. Although embodiments of nodes of systems 100, 200 may be illustrated using a particular communications media by way of example, it may be appreciated that the principles and techniques discussed herein may be implemented using any type of communication media and accompanying technology. The embodiments are not limited in this context.

When implemented as a wired system, for example, embodiments of nodes of systems 100, 200, system 100 may include one or more nodes arranged to communicate information over one or more wired communications media. Examples of wired communications media may include a wire, cable, printed circuit board (PCB), backplane, switch fabric, semiconductor material, twisted-pair wire, co-axial cable, fiber optics, and so forth. The communications media may be connected to a node using an input/output (I/O) adapter. The I/O adapter may be arranged to operate with any suitable technique for controlling information signals between nodes using a desired set of communications protocols, services or operating procedures. The I/O adapter may also include the appropriate physical connectors to connect the I/O adapter with a corresponding communications medium. Examples of an I/O adapter may include a network interface, a network interface card (NIC), disc controller, video controller, audio controller, and so forth. The embodiments are not limited in this context.

When implemented as a wireless system, for example, embodiments of nodes of systems 100, 200 may include one or more wireless nodes arranged to communicate information over one or more types of wireless communication media, sometimes referred to herein as wireless shared media. An example of a wireless communication media may include portions of a wireless spectrum, such as the radio-frequency (RF) spectrum. The wireless nodes may include components and interfaces suitable for communicating information signals over the designated wireless spectrum, such as one or more antennas, wireless transmitters/receivers ("transceivers"), amplifiers, filters, control logic, and so forth. As used herein, the term "transceiver" may be used in a very general sense to include a transmitter, a receiver, or a combination of both. Examples for the antenna may include an internal antenna, an omni-directional antenna, a monopole antenna, a dipole antenna, an end fed antenna, a circularly polarized antenna, a micro-strip antenna, a diversity antenna, a dual antenna, an antenna array, a helical antenna, and so forth. The embodiments are not limited in this context.

In one embodiment, each module 120*a–n* may comprise a processor. For example, a processor may be implemented as a general purpose processor, such as a general purpose processor made by Intel® Corporation, Santa Clara, Calif. In another example, processor may include a dedicated processor, such as a controller, microcontroller, embedded processor, a digital signal processor (DSP), a field programmable gate array (FPGA), a programmable logic device (PLD), a network processor, an I/O processor, AP, CP, and so forth. The embodiments are not limited in this context.

In one embodiment, systems 100, 200 substrate 110 may comprise an element 140. In one embodiment, for example, element 140 may comprise memory. Memory 140 may include any machine-readable or computer-readable media capable of storing data, including both volatile and non-volatile memory. For example, memory 140 may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. The embodiments are not limited in this context.

Figure 3:
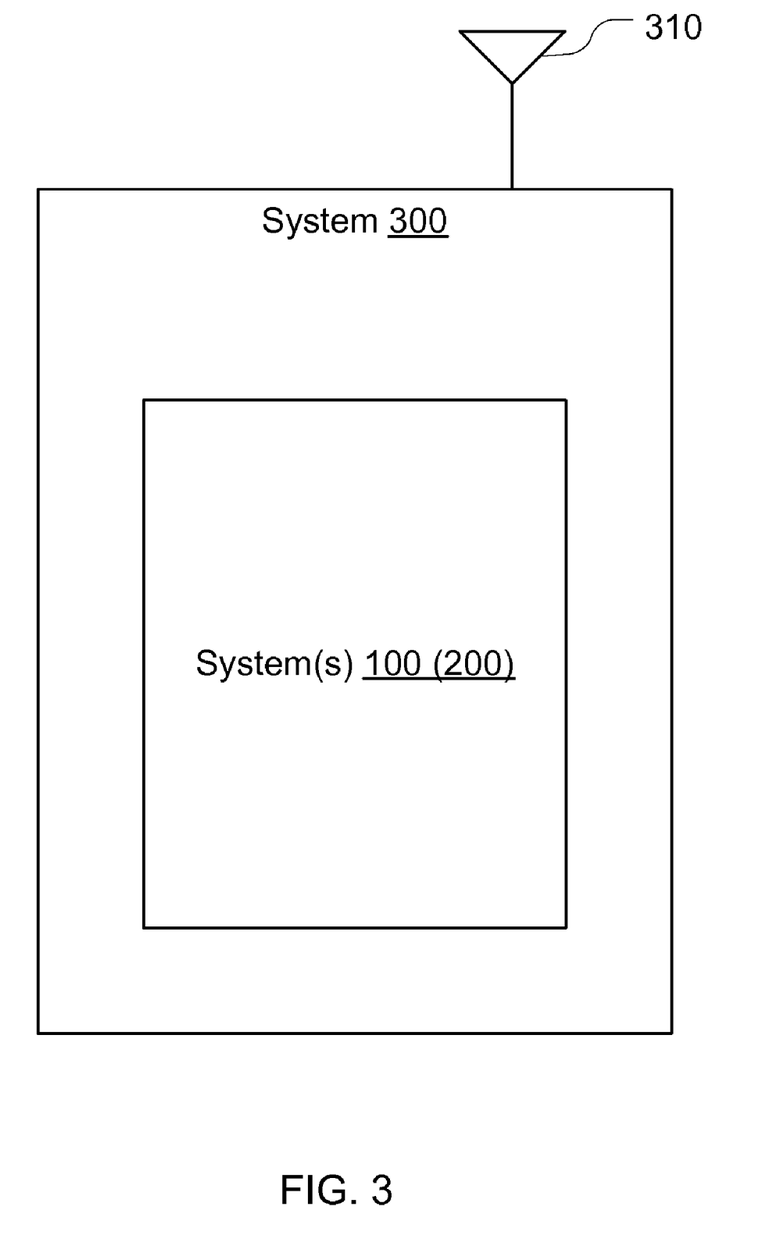
FIG. 3 illustrates one embodiment of system 300.

FIG. 3 illustrates one embodiment of a system 300. System 300 may comprise any wireless platform or device comprising system 100 and/or system 200, and antenna 310, for example. Various embodiments of system 300 may comprise, for example, a wireless device such as a wireless telephone, cellular telephone, wireless handset, mobile lap top, vending machine, automated pass for tolls or vending, Global Positioning System (GPS), and the like, for example.

Operations for the above systems, nodes, apparatus, elements, and/or subsystems may be further described with reference to the following figures and accompanying examples. Some of the figures may include programming logic. Although such figures presented herein may include a particular programming logic, it can be appreciated that the programming logic merely provides an example of how the general functionality as described herein can be implemented. Further, the given programming logic does not necessarily have to be executed in the order presented unless otherwise indicated. In addition, the given programming logic may be implemented by a hardware element, a software element executed by a processor, or any combination thereof. The embodiments are not limited in this context.

Figure 4:
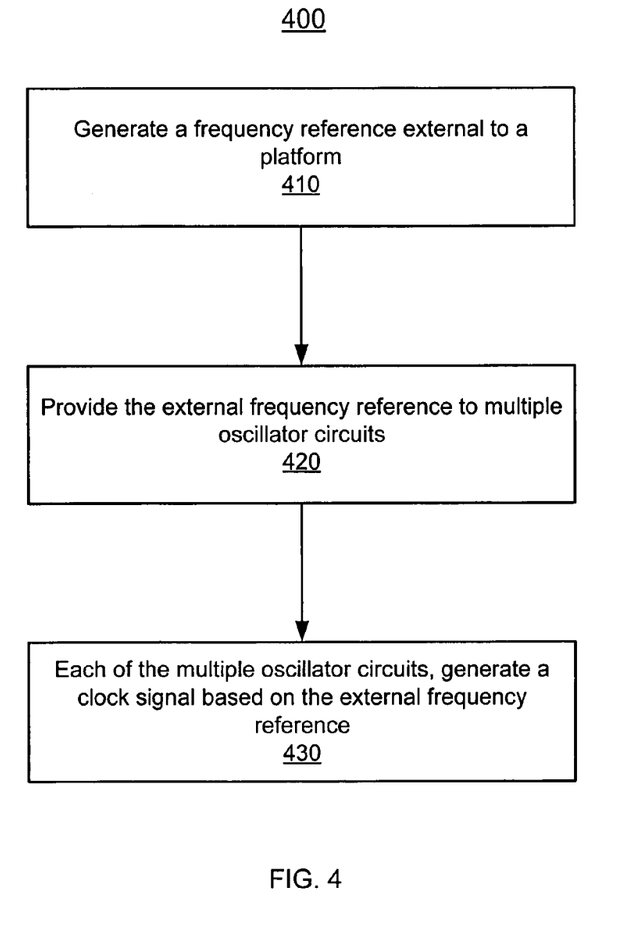
FIG. 4 illustrates one embodiment of a logic flow 400.

FIG. 4 illustrates one embodiment of a logic flow 400. FIG. 4 illustrates a logic flow 400. Logic flow 400 may be representative of the functions of one or more structures described herein, such as systems 100, 200, and 300, for example. As shown, in logic flow 400 with respect to systems 100, 200, 300 oscillator network 130 generates (410) a frequency reference and provides (420) the frequency reference to multiple oscillator circuits 122*a–n*. Multiple oscillator circuits 122*a–n* may be located within multiple modules 120*a–n* of a platform on substrate 110. Each of multiple oscillator circuits 122*a–n* generates (430) a clock signal based on the external frequency reference provided by oscillator network 130. The external frequency reference may be provided through oscillator input pins 114*a–b*, 116*a–b*, and 118*a–b*. Each one of multiple oscillator circuits 122*a–n* detects the amplitude of the external frequency reference and adjusts or scales back a drive current generated by current source 220*a–n* associated with the multiple oscillator circuits 122*a–n* based on the detected amplitude or slew rate of the external frequency reference signal. The drive current may be scaled back to minimize the amplitude, for example. The clock signals may be synchronized to the frequency reference.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware, such as a circuit, an application specific integrated circuit (ASIC), Programmable Logic Device (PLD) or digital signal processor (DSP), and so forth. In yet another example, an embodiment may be implemented by any combination of programmed general-purpose computer components and custom hardware components. The embodiments are not limited in this context.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. An apparatus, comprising:
   multiple modules comprising an internal oscillator circuit located on a substrate, wherein at least one of said multiple modules comprises an input port; and
   an oscillator network located external to said multiple modules, said oscillator network coupled to at least one of said internal oscillator circuits through said input port, said oscillator network to provide a reference frequency to said oscillator circuit; wherein said internal oscillator circuit is to generate a reference frequency signal; and wherein at least one of said multiple modules comprises an automatic amplitude control circuit (AAC) coupled to said oscillator network, said AAC comprising a current source.

2. The apparatus of claim 1, wherein said multiple modules comprise at least an application processor and at least a communication processor.

3. The apparatus of claim 1, wherein each of said internal oscillator circuits comprises first and second input pins, and wherein each of said first input pins are connected to each of said second input pins.

4. The apparatus of claim 1, wherein said substrate comprises a platform for any one of a wireless, mobile, and handheld device.

5. The apparatus of claim 1, wherein said oscillator network comprises at least a crystal.

6. The apparatus of claim 1, wherein said oscillator network comprises at least a resonator.

7. The apparatus of claim 1, wherein at least one of said multiple modules comprises a crystal integrated therewith.

8. The apparatus of claim 1, wherein at least one of said multiple modules comprises at least a capacitor integrated therewith.

9. The apparatus of claim 1, wherein said AAC is to detect the amplitude of said reference frequency signal and to adjust a drive current generated by said current source based on the detected amplitude of said reference frequency signal.

10. The apparatus of claim 9, wherein said AAC is to adjust said drive current to adjust the amplitude of said reference frequency signal.

11. The apparatus of claim 1, wherein said AAC is to detect the slew rate of said reference frequency signal and to adjust a drive current generated by said current source based on the detected slew rate of said reference frequency signal.

12. The apparatus of claim 1, wherein two or more of said multiple modules are to synchronize a clock signal based on said reference frequency signal.

13. A system, comprising:
   an antenna;
   a substrate coupled to said antenna, said substrate comprising an input port; multiple modules located within said substrate, wherein each of said multiple modules comprises an internal oscillator circuit; and
   an oscillator network coupled to each of said internal oscillator circuits through said input port, said oscillator network to provide a reference frequency to said oscillator circuit;
   wherein said internal oscillator circuit is to generate a reference frequency signal; and
   wherein each of said internal oscillator circuits comprises first and second input pins, and wherein each of said first input pins are connected to each of said second input pins, said connections are located internal to said substrate.

14. The system of claim 13, wherein said multiple modules comprise at least an application processor and at least a communication processor.

15. The system of claim 13, wherein said substrate comprises a platform for any one of a wireless, mobile, and handheld device.

16. The system of claim 13, wherein said oscillator network comprises at least a crystal to couple said oscillator network to said port.

17. The system of claim 13, wherein said oscillator network comprises at least a resonator.

18. The system of claim 13, wherein at least one of said multiple modules comprises a crystal integrated therewith.

19. The system of claim 13, wherein at least one of said multiple modules comprises at least a capacitor integrated therewith.

20. A system, comprising:
   an antenna;
   a substrate coupled to said antenna, said substrate comprising an input port; multiple modules located within said substrate, wherein each of said multiple modules comprises an internal oscillator circuit; and an oscillator network coupled to each of said internal oscillator circuits through said input port, said oscillator network to provide a reference frequency to said oscillator circuit;

wherein said internal oscillator circuit is to generate a reference frequency signal; and wherein at least one of said multiple modules comprises an automatic amplitude control circuit (AAC) coupled to said oscillator network, said AAC comprising a current source.

21. The system of claim 20, wherein said AAC is to detect the amplitude of said reference frequency signal and to adjust a drive current generated by said current source based on the detected amplitude of said reference frequency signal.

22. The system of claim 21, wherein said AAC is to adjust said drive current to adjust the amplitude of said reference frequency signal.

23. The system of claim 20, wherein said AAC is to detect the slew rate of said reference frequency signal and to adjust a drive current generated by said current source based on the detected slew rate of said reference frequency signal.

24. The system of claim 20, wherein two or more of said multiple modules are to synchronize a clock signal based on said reference frequency signal.

25. A method, comprising:

generating a frequency reference external to multiple oscillator circuits located on a substrate;

providing said external frequency reference to said multiple oscillator circuits located within multiple modules on said substrate;

generating a clock signal by each of said multiple oscillator circuits based on said external frequency reference;

detecting an amplitude of said external frequency reference by said multiple oscillator circuits; and scaling back a drive current associated with said multiple oscillator circuits based on said detected amplitude.

26. The method of claim 25, wherein providing said external frequency reference, comprises providing said external frequency reference through an input port.

27. The method of claim 25, further comprising:
scaling back said drive current to adjust said amplitude.

28. The method of claim 25, further comprising:
synchronizing said clock signals to said external frequency reference.

* * * * *